United States Patent [19]
Oldfield et al.

[11] Patent Number: 5,801,525
[45] Date of Patent: Sep. 1, 1998

[54] FREQUENCY DISCRIMINATING POWER SENSOR

[75] Inventors: William Oldfield, Redwood City; Russell Brown, San Jose; Michael Osborne, Morgan Hill, all of Calif.

[73] Assignee: Wiltron Company, Morgan Hill, Calif.

[21] Appl. No.: 662,052

[22] Filed: Jun. 12, 1996

[51] Int. Cl.⁶ ........................................... G01R 23/16
[52] U.S. Cl. .................... 324/76.31; 324/76.29; 324/77.11
[58] Field of Search ........................ 324/76.29, 76.31, 324/77.11, 76.35, 76.45, 76.46

[56] References Cited

U.S. PATENT DOCUMENTS

| | | | |
|---|---|---|---|
| 2,851,661 | 9/1958 | Buland | 324/77.11 |
| 3,167,710 | 1/1965 | Cox | 324/77.11 |
| 3,303,420 | 2/1967 | Harris | 324/76.45 |
| 3,417,397 | 12/1968 | List | 324/77.11 |
| 5,075,619 | 12/1991 | Said | 324/76.31 |
| 5,291,125 | 3/1994 | Tsui | 324/76.31 |

*Primary Examiner*—Ernest P. Karlsen
*Assistant Examiner*—Jose M. Solis
*Attorney, Agent, or Firm*—Fliesler, Dubb, Meyer & Lovejoy, LLP

[57] ABSTRACT

A power sensor that enables determination of the frequency of a microwave signal comprises a signal input that receives the microwave signal at a particular frequency, at least one sensor that produces a first and second output corresponding to the power of the microwave signal, and a means for coupling the signal input to the sensor so that the coupling means distinguishes the first output from the second output in order that the ratio of these outputs produces a unique value at the particular frequency.

5 Claims, 6 Drawing Sheets

FREQUENCY DISCRIMINATING POWER SENSOR

BACKGROUND OF THE INVENTION

1. Field of the Invention

The present invention generally relates to the measurement of the power of a microwave signal. More particularly, the present invention relates to a power sensor that determines the frequency of a microwave signal in order to measure the signal's power using a power meter.

2. Description of the Related Art

Power meters that directly measure the power of a microwave signal are available and are very useful for many microwave measurements. A conventional power meter 10, as illustrated in FIG. 1, is able to measure the power of a microwave signal input to the power meter 10 at power reference 20. A typical example of power meter 10 would be the HP 437B Power Meter manufactured by Hewlett-Packard Company of Palo Alto, Calif. To measure the power of a microwave signal, a power sensor 30 is connected to the sensor reference 40 of the power meter 10 by means of a power sensor cable 50. Power meter 30 comes with a family of power sensors, each covering a different frequency range, which converts the microwave power of a signal to a sensor voltage proportional to the power. This sensor voltage is conveyed to the power meter 10 where the power representative of the sensor voltage is determined and displayed on the power meter display 60.

An adjustment to the power measured by the power meter 10 is necessary since the power to voltage conversion changes with frequency. That is, there is an error in measurement of the power of the microwave signal due to the frequency response of the power sensor. To account for this error, a calibration factor is adjusted on the power meter 10. The calibration factor is a numerical value that represents the ratio between the sensor output voltage at a particular frequency and sensor output voltage at a calibrating frequency, given the same input power at both frequencies. The calibration factor varies at different frequencies, and is usually expressed as a percentage, with 100% corresponding to the calibration factor at the calibration frequency.

The calibration factor has conventionally been applied using one of two methods. Using one method, a table of calibration factors at different frequencies may be referred to by a user. Such a table is illustrated in FIG. 1A, and may be found on the power sensor 30. The table 70 lists a range of frequencies with corresponding calibration factors. The table also typically lists a value of Rho for each frequency, where Rho is a measure of the proportion of applied signal that is reflected from the input of the power sensor. Reflection of applied signal varies with frequency, and can affect measurement accuracy. A user determines the corresponding calibration factor from the table 70 and enters the calibration factor into the power meter 10 using function keys 110. Use of this table 70 requires knowledge of the frequency being measured since the appropriate calibration factor can only be determined from the table 70 using the known frequency. This is inconvenient, at best, when the frequency of the signal is known, and impossible when the frequency is unknown.

A second method of determining the calibration factor is to use a preloaded calibration table that is previously stored in the power meter 10. To use this preloaded calibration table, a user must enter the frequency of the microwave signal into the power meter 30 using function keys 110 since the frequency still cannot be determined from the power meter output. The power meter 10 determines the calibration factor from the frequency entered and adjusts the power measurement accordingly.

Both of these methods require knowledge of the frequency of the microwave signal being measured in order to determine the calibration factor and Rho value. Without knowledge of the frequency of the microwave signal by the user, an accurate power measurement cannot be performed.

It is, therefore, desirable to have a power sensor that determines the frequency of a microwave signal.

SUMMARY OF THE INVENTION

The present invention provides a power sensor that determines the frequency of a microwave signal.

The present invention also provides a power sensor that enables a power meter to determine the frequency of a microwave signal in order to enable the power meter to select a proper calibration factor to read absolute power.

The present invention includes a power sensor for determining the frequency of a microwave signal received at a signal input node. In one embodiment, the power sensor includes a path divider coupling an input signal to a first and second path, the first path being connected to a first sensor which produces a first output corresponding to the power of the microwave signal as dependent on frequency. The power sensor also includes a second sensor coupled to a second path output of the path divider for producing a second output corresponding to the power of the microwave signal as dependent on frequency. The second path also contains a frequency sensitive circuit located between the signal input node and the second sensor to enable distinguishing the second output from the first output so that the ratio of outputs from the first and second sensors produces a unique value corresponding to the frequency of the microwave signal.

The present invention further provides for a method of determining a unique value corresponding to each particular frequency of a microwave signal when measuring power using the power sensor of the present invention.

In the method, the first and second outputs are measured from the sensors for a signal at known frequencies. A unique value is then measured at each known frequency from the first and second outputs by taking the ratio of the outputs. The unique values for each one of a plurality of microwave signal frequencies at each different frequency may then be stored. After the unique values are measured and stored, the frequency of a device producing a power output at an unknown frequency is determined by measuring a unique value for the microwave signal with an unknown frequency and comparing the unique value to the stored unique values to locate a closely matching stored unique value where the frequency of the microwave signal closely corresponds to the frequency of the matching stored unique value. Interpolation between stored unique values may be used to increase accuracy of the frequency determination or to reduce the number of unique values that must be stored to achieve a given frequency accuracy.

BRIEF DESCRIPTION OF THE DRAWINGS

Further details of the present invention are explained with the help of the attached drawings in which.

DETAILED DESCRIPTION OF THE INVENTION

Figure 1:
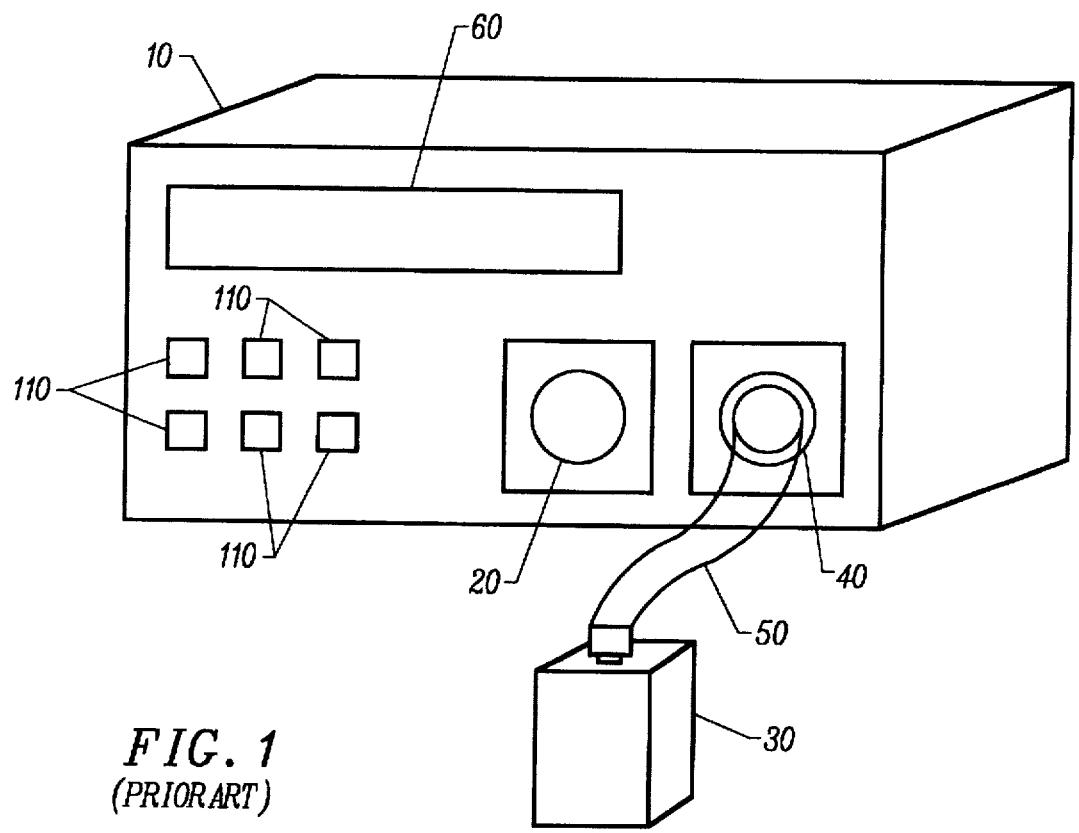
FIG. 1 illustrates a perspective view of a prior art power meter.
Figure 2A:
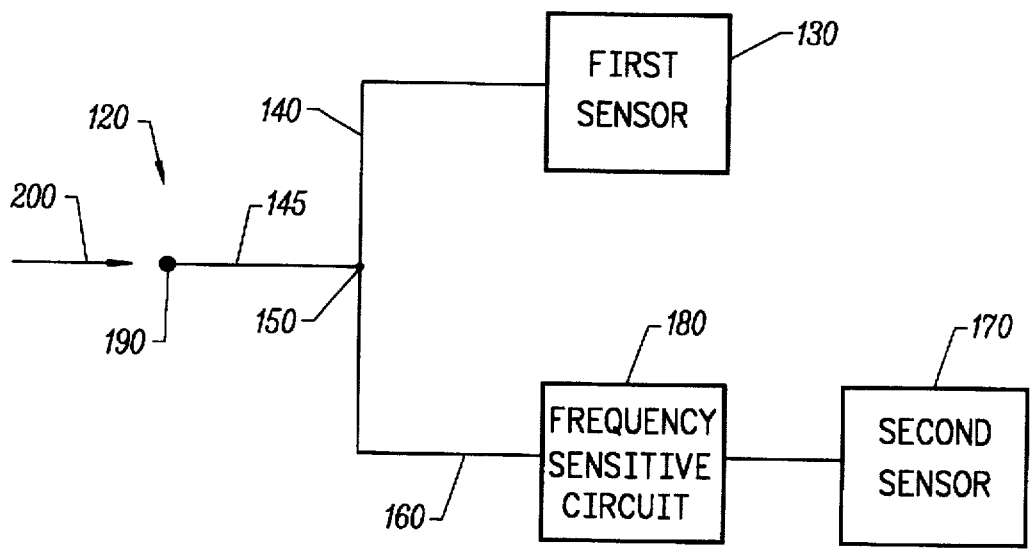
FIG. 2A illustrates a block diagram of the preferred embodiment of the present invention.

FIG. 2A illustrates a block diagram of the power sensor 120 for determining the frequency of a microwave signal of the present invention. A first sensor 130 is located at the end of a first path 140 which begins at a path divider 150. Both the first path 140 and the path divider 150 in this embodiment are electrical lines, but other means of transferring microwave signals may be used. The path divider 150 splits a microwave signal 200, entering at a signal input node 190 and transferred to the path divider 150 via an electrical line 145, into two paths, the first path 140 and a second path 160. The electrical line 145 serves as a divider input, while the first 140 and second 160 paths are first and second divider outputs, respectively. The second path 160 begins at the path divider 150 and ends at a second sensor 170. A frequency sensitive circuit 180 is located along the second path 160 between the path divider 150 and the second sensor 170.

In use, a plurality of unique values are first measured using a microwave signal with known frequency at a multitude of known frequencies, each unique value corresponding to a microwave signal 200 at a different frequency. Each unique value is then stored in an electronic table (not shown), along with its corresponding frequency. The unique values are measured as follows. A microwave signal 200 enters the signal input node 190 of the power sensor 120. The microwave signal 200 travels to the path divider 150 where it is divided into two paths, the first path 140 and the second path 160. Along the first path, the microwave signal 200 is provided to the first sensor 130 where a first output is produced corresponding to the power measured by the first sensor 130. Along the second path 160, the microwave signal 200 goes through a frequency sensitive circuit 180 to reach the second sensor 170. The frequency sensitive circuit 180 is essentially a circuit that provides a varying attenuation or gain output as the frequency of the microwave signal 200 is changed. An example of a frequency sensitive circuit 180 is a length of coaxial cable. The longer and the smaller the coaxial cable, the greater the power output versus frequency variation. A length of very small coaxial cable is an ideal frequency sensitive circuit 180 for this application. It is understood, however, that various frequency sensitive circuits that provide a change in attenuation or gain, as the frequency of the microwave signal is changed, can be used other than a coaxial cable to achieve the frequency sensitivity of the present invention.

At the end of the second path 160 is a second sensor 170, which produces a second output corresponding to the power of the microwave signal 200 which has been attenuated or amplified through the frequency sensitive circuit 180. There is, therefore, a first output from the first sensor 130 that provides a measurement of the power of the unattenuated or unamplified microwave signal 200 and a second output from the second sensor 170 that provides a measurement of the power of an attenuated or amplified microwave signal 200 with frequency sensitivity different from that of the first path, enabling a determination of frequency.

Figure 2B:
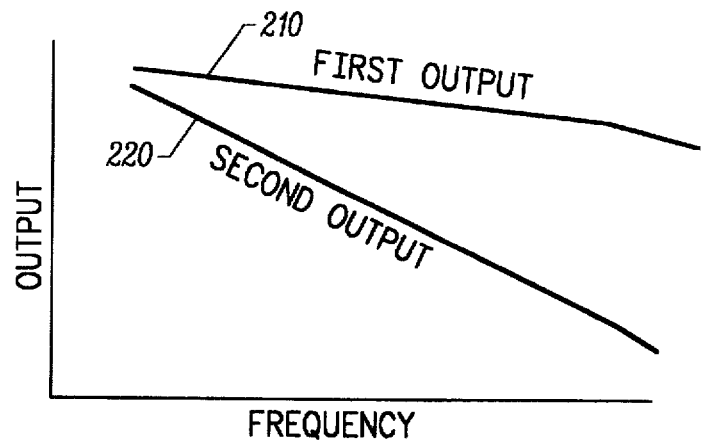
FIG. 2B illustrates a graph of the output versus frequency of the FIG. 2A embodiment.

The two outputs are illustrated in graphical format in FIG. 2B. At any given frequency, the ratio of the first output 210 of the first sensor 130 to the second output 220 of the second sensor 170 provides a unique value for each frequency. The frequency uniqueness for each unique value is due to the attenuation or gain provided in the second path 160 by the frequency sensitive circuit 180 that causes the first output 210 to have a power loss (or gain) relative to the second output 220 which is dependent on frequency. This unique value measured for an input signal 200 of known frequency is stored in an electronic table so that it may be compared to a unique value of a microwave signal of unknown frequency to be measured. An EPROM may serve as the electronic table for storing the unique values and corresponding frequencies in the preferred embodiment. It is understood, however, that other electronic devices that store numerical values may be used. The above method for determining a unique value for a signal of known frequency is repeated for a predetermined number of microwave signals of known frequency, each unique value and corresponding frequency being stored in the electronic table.

Once the unique values for the microwave signals 200 are stored in the electronic table, the power sensor may be used to determine the frequency of a microwave signal 200 applied to the power sensor by measuring a unique value for the microwave signal using the method as described above and comparing it to the stored unique values to find a closely matching stored value. Once a closely matching stored value is located in the electronic table, the frequency of the microwave signal is determined to closely correspond to the frequency of the stored unique value. Interpolation between stored unique values may be used to increase accuracy of the frequency determination or to reduce the number of stored unique values needed to achieve a given frequency accuracy.

The unique value for the unknown microwave signal is measured in the same manner used above with respect to the method of determining the stored unique values. That is, referring to FIG. 2A, a microwave signal 200 enters the signal input 190 of the power sensor 120. The microwave signal 200 travels to the path divider 150 where it is divided into two paths, the first path 140 and the second path 160. Along the first path, the microwave signal 200 is provided to the first sensor 130, where a first output is measured corresponding to the power measured by the first sensor 130. Along the second path 160, the microwave signal 200 goes through a frequency sensitive circuit 180 to reach the second sensor 170 which provides a varying attenuation or gain as the microwave signal 200 changes frequency.

At the end of the second path 160 is a second sensor 170, which produces an output corresponding to the power of the microwave signal 200 that has been attenuated or amplified through the frequency sensitive circuit 180. From the two outputs, a unique value for the microwave signal 200 is measured by taking the ratio of the first and second outputs. The unique value is compared to the stored unique values in the electronic table to find a closely matching stored unique value. Once the most closely matching stored unique value is found from the table, the corresponding frequency of the stored unique value becomes the measured frequency of the microwave signal's unique value, and, therefore, of the microwave signal 200. Interpolation between stored unique values may be used to increase accuracy of the frequency determination or to reduce the number of stored unique values needed to achieve a given frequency accuracy.

Figure 1A:
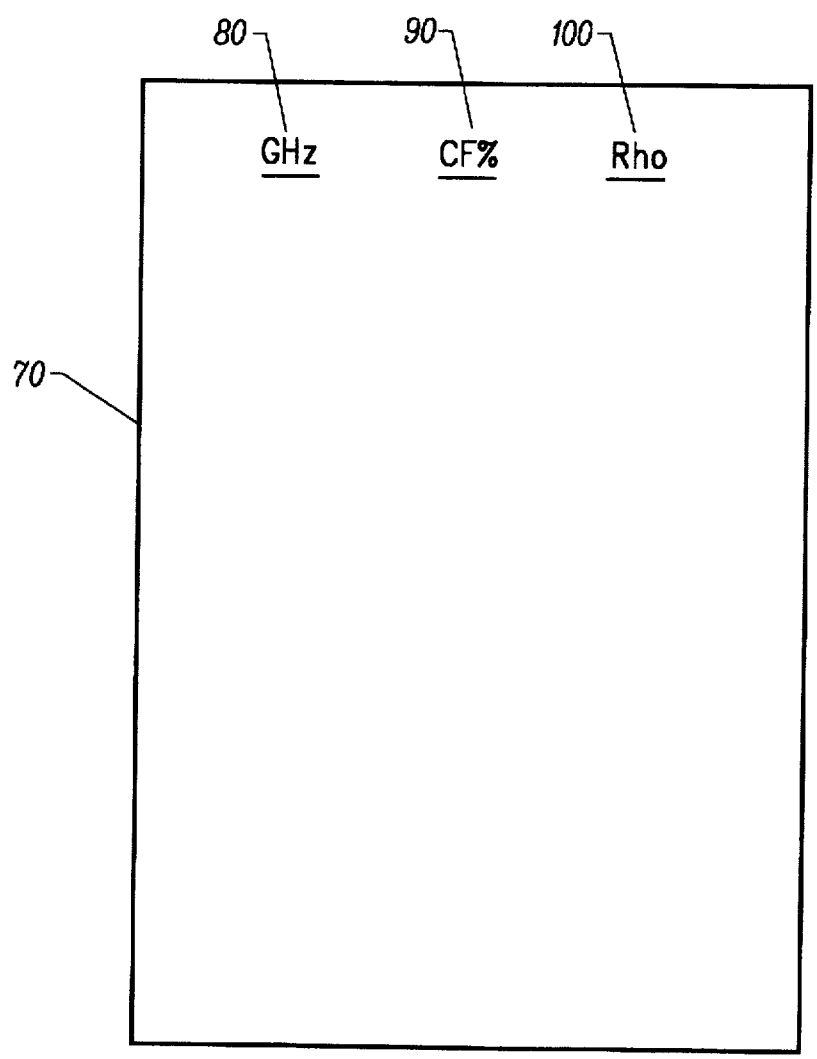
FIG. 1A illustrates a table used in a prior art method to determine the calibration factor of a power measurement.

Once the frequency of the microwave signal 200 is measured, the power of the microwave signal 200 may be determined by adjusting the power meter by a calibration factor corresponding to the known frequency in order to calibrate the power meter. This adjusting of the calibration factor may be don e in several ways. One way of adjusting the calibration factor on the power meter is to have the power meter display the measured frequency to allow the user to determine the calibration factor from a table as illustrated in FIG. 1A and input that calibration factor into the power meter. It is also possible for a power meter to do the entire calibration adjustment internally by measuring the frequency of the microwave signal and internally sending the measured frequency to a calibration factor table stored in the power meter where the calibration factor is determined. The adjustment is made by the power meter and then displayed.

Figure 3A:
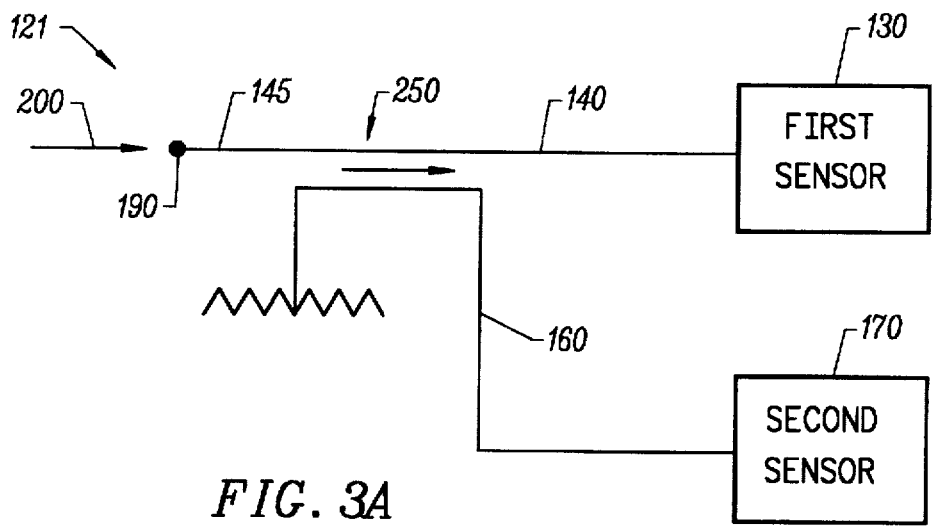
FIG. 3A illustrates a second embodiment of the present invention.

FIG. 3A illustrates a block diagram of a second embodiment 121 of the present invention. This second embodiment 121 has a coupler 250 that replaces both the path divider 150 and frequency sensitive circuit 180 of the preferred embodiment of the present invention illustrated in FIG. 2A Similar parts of this second embodiment 121 of the present invention to those of FIG. 2A will be referenced accordingly. The function and structure of similarly referenced parts are intended to be identical to the corresponding parts previously described. A signal input node 190 is connected via an electrical line 145 to a coupler 250 which acts as a path divider to divide the microwave signal 200 into two paths. The first path 140 is provided to a first sensor 130, while the second path 160 is provided to a second sensor 170. The coupler 250 also serves as the frequency sensitive circuit 180 of the preferred embodiment of the present invention illustrated in FIG. 2A because of its frequency sensitive attenuation differences between its paths. The first 130 and second 170 sensors, thus, produce first and second outputs, respectively, that may be ratioed to produce a unique value for a plurality of microwave signals 200 at different frequencies, each unique value corresponding to a different frequency.

Figure 3B:
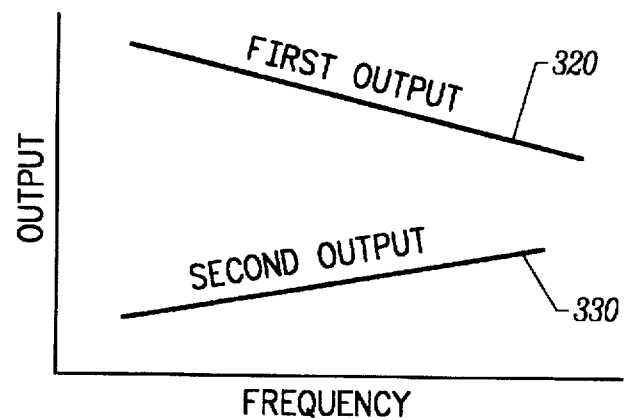
FIG. 3B illustrates a graph of the output versus frequency of the second embodiment of FIG. 3A.

FIG. 3B illustrates, in graphical format, the first 320 and second 330 outputs versus frequencies of the outputs measured by the first 130 and second 170 sensors, respectively. From the graph, the second output 330 has been attenuated by coupler 250 to form a sloped output versus frequency line. Because of the different attenuation values, the ratio of the first output 320 to the second output 330 provides a unique value at each frequency. Thus, as described with respect to the embodiment of FIG. 2A, to determine frequency, unique values may be measured for a known signal across a range of known signal frequencies from the first 320 and second 330 outputs and ratioed to produce unique values. These unique values and corresponding frequencies are stored in an electronic table (not shown) to be compared to a unique value of a microwave signal 200 with an unknown frequency. Once a unique value is measured for a signal with an unknown frequency, it is compared to a table of stored unique values to find the most closely matching stored value. The frequency corresponding to the most closely matching stored unique value becomes the measured frequency for the unknown signal. Interpolation between stored unique values may be used to increase accuracy of the frequency determination or to reduce the number of stored unique values needed to achieve a given frequency accuracy.

In use, the second embodiment 121 functions in the same manner as the first embodiment illustrated in FIG. 2A, with the coupler 250 performing the functions of, and replacing, the path divider 150 and frequency sensitive circuit 180 of that embodiment 121. The coupler 250 essentially creates a sloped attenuation versus frequency, as illustrated in FIG. 3B. An advantage of using a coupler 250 in lieu of a path divider 150 and frequency sensitive circuit 180 is the ability to use one circuit (coupler 250) to perform both functions of the path divider 150 and frequency sensitive circuit 180. The coupler 250 has the property of creating a sloped attenuation versus frequency intrinsically as the loss of the coupler 250 decreases when the frequency of a microwave signal 200 increases.

Figure 4A:
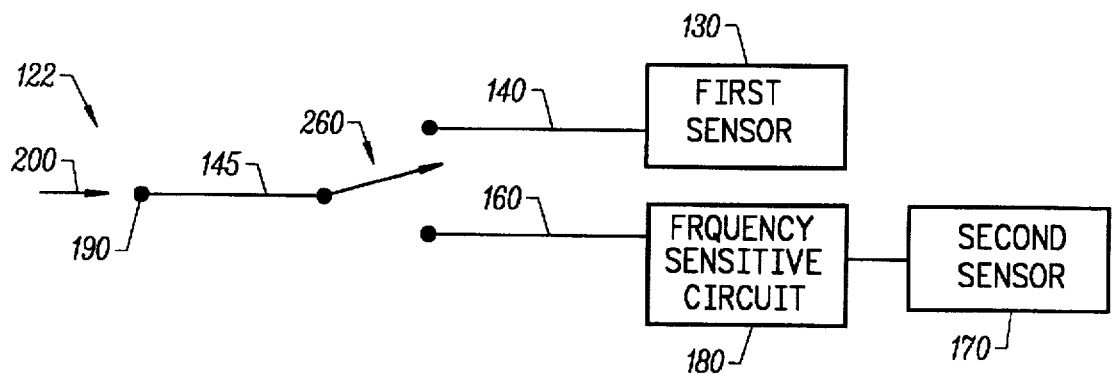
FIG. 4A illustrates a third embodiment of the present invention.
Figure 4B:
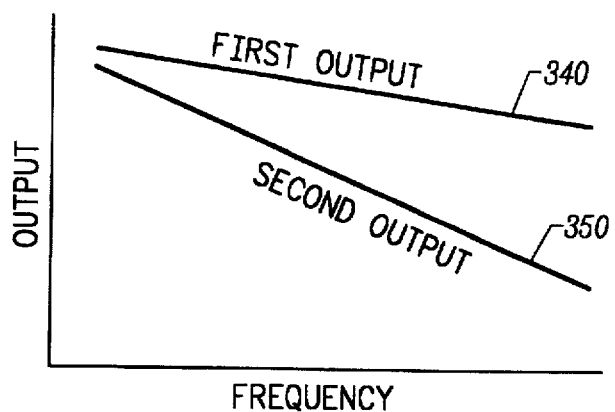
FIG. 4B illustrates a graph of the output versus frequency of the third embodiment of FIG. 4A.

FIG. 4A illustrates a block diagram of a third embodiment 122 of the present invention. This embodiment 122 has a microwave switch 260 that serves as the path divider 150 of the embodiment illustrated in FIG. 2A. Similar parts of this embodiment 122 of the present invention to those of FIG. 2A will be referenced accordingly. Similarly referenced parts are intended to be of identical function and structure as those same parts in FIG. 2A. A signal input node 190 is connected to a microwave switch 260 by an electrical line 145. The electrical line 145 serves as a switch input for the microwave switch 260. The microwave switch 260 divides the microwave signal 200 into two paths. The first path 140 terminates at a first sensor 130. The second path 160 terminates at a second sensor 170, with a frequency sensitive circuit 180 located between the microwave switch 260 and the second sensor 170. The first 140 and the second 160 paths serve as first and second switch outputs, respectively. The microwave switch 260 selects between the first 140 and the second 160 paths, and accordingly, the first 130 and the second 170 sensors, to produce first 340 and second 350 outputs, as illustrated in graphical format in FIG. 4B. These outputs are ratioed to produce unique values for the plurality of microwave signals 200, each unique value corresponding to each frequency as previously described with respect to FIG. 2A. After the unique values and corresponding frequencies are incorporated in an electronic table, the unique value of a microwave signal of unknown frequency can be determined and compared with the stored unique values so that the frequency of the microwave signal can be determined.

The third embodiment 122 is used in a similar manner as the embodiment illustrated in FIG. 2A, with a microwave switch 260 performing the function of the path divider 150. An advantage of using a microwave switch 260 in lieu of a path divider 150 is that the signal power is directed to only one path at a time rather than being continuously divided between two or more paths. Each sensor, when its path is selected by the microwave switch 260, receives more of the signal power than it might if a power splitter were used. Increasing the proportion of the input signal that reaches each sensor facilitates the measurement of signals that have less power.

Figure 5A:
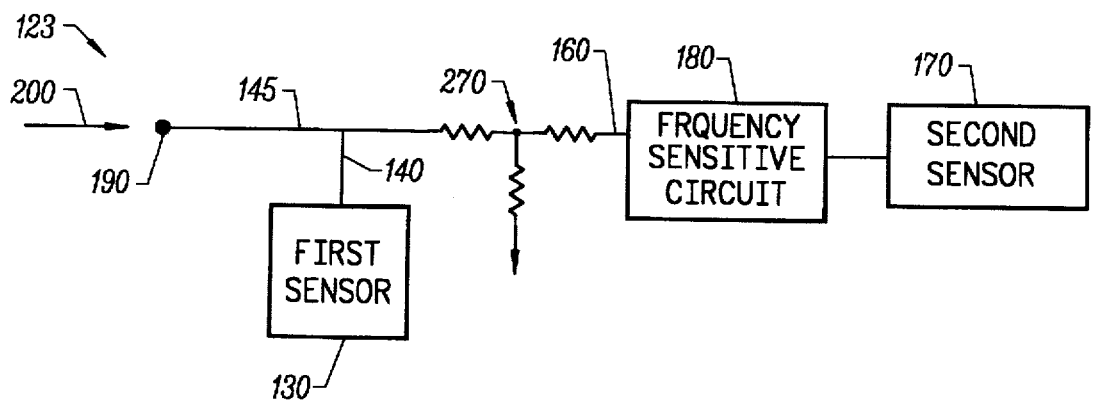
FIG. 5A illustrates a fourth embodiment of the present invention.

FIG. 5A illustrates a fourth embodiment 123 of the present invention. This embodiment 123 uses an attenuator 270 that attenuates the signal sensed at the second sensor 170. The parts illustrated in FIG. 5A with identical reference numerals to those of FIG. 2A are identical to, and function the same as, those parts previously described. A signal input node 190 is connected to the attenuator 270 by an electrical line 145. A first path 140 terminates at a first sensor 130. A second path 160 ends at a second sensor 170 with a frequency sensitive circuit 180 located between the attenuator 270 and the second sensor 170. The output measured at the second sensor 170 is attenuated by the value of the attenuator 270 and frequency sensitive circuit 180.

Figure 5B:
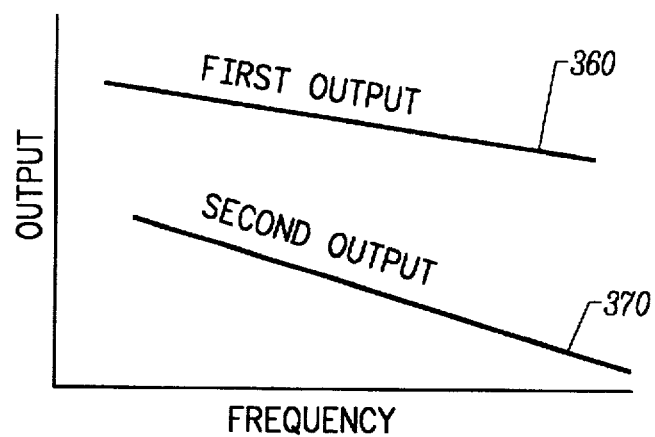
FIG. 5B illustrates a graph of the output versus frequency of the fourth embodiment of FIG. 5A.

The fourth embodiment 123 is used in the same manner as the embodiment illustrated in FIG. 2A, and previously described, except that the attenuator 270 serves to attenuate the microwave signals 200. The attenuator 270 attenuates the microwave signal 200 to produce first 360 and second 370 outputs, respectively, as illustrated in graphical format on FIG. 5B. These outputs are ratioed to produce unique values, each corresponding to the frequency of each of the microwave signals 200. A multitude of these unique values are stored and used to measure the unknown frequency of a microwave signal 200 as previously described with respect to FIG. 2A. The attenuator 270 also serves as a termination element for the first sensor 130.

Figure 6A:
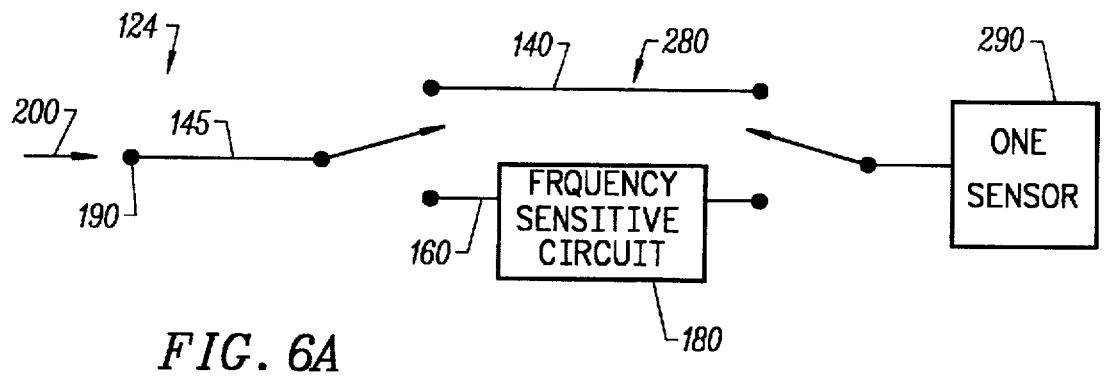
FIG. 6A illustrates a fifth embodiment of the present invention.

FIG. 6A illustrates a fifth embodiment 124 of the present invention. This embodiment 124 uses a DPDT (Double Pole Double Throw) switch 280 to select a first path 140 or a second path 160 to selectively transmit the microwave signal 200 to a sensor 290. A frequency sensitive circuit 180 is located in second path 160 such that second path 160 and first path 140 have different attenuation or gain versus frequency characteristics. Unlike previous embodiments, an advantage of using the DPDT switch 280 is that only one sensor 290 is required.

Figure 6B:
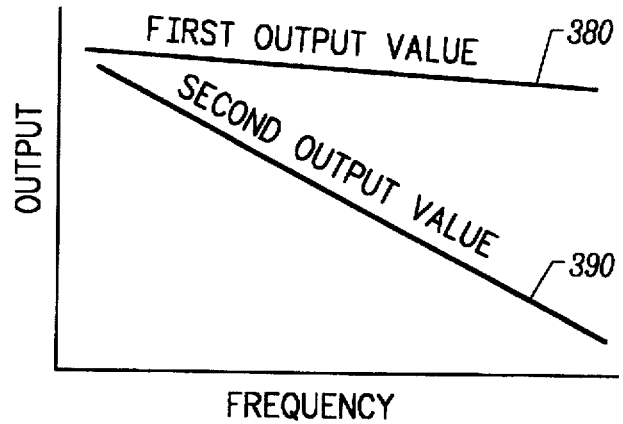
FIG. 6B illustrates a graph of the output versus frequency of the fifth embodiment of FIG. 6A.

In use, a predetermined number of microwave signals 200, each at a different frequency, are sent through the fifth embodiment 124 beginning at the signal input node 190. The signal input node 190 is connected to the DPDT switch 280 by an electrical line 145. At the DPDT switch 280, the switch 280 selects a path, either the first 140 or the second 160 path, to send the microwave signal 200 to the sensor 290. The first 140 and second 160 paths are the thru and sloped attenuation versus frequency paths, respectively, of the DPDT switch 280. At the sensor 290, a first output 380 and a second output 390, as illustrated in FIG. 6B for a predetermined range of frequencies, are measured.

From these outputs, unique values are measured and stored as described with regard to previous embodiments using an input signal of known frequency at a multitude of known frequencies, as in FIG. 2A. These unique values and corresponding frequencies are stored in an electronic table. Then, a unique value is measured for a microwave signal 200 of unknown frequency, as previously described with regard to FIG. 2A, and the frequency is thereby determined. The frequency value may then be used to access calibration factor and other data so that the power of the microwave signal can be accurately determined as previously described.

Figure 7A:
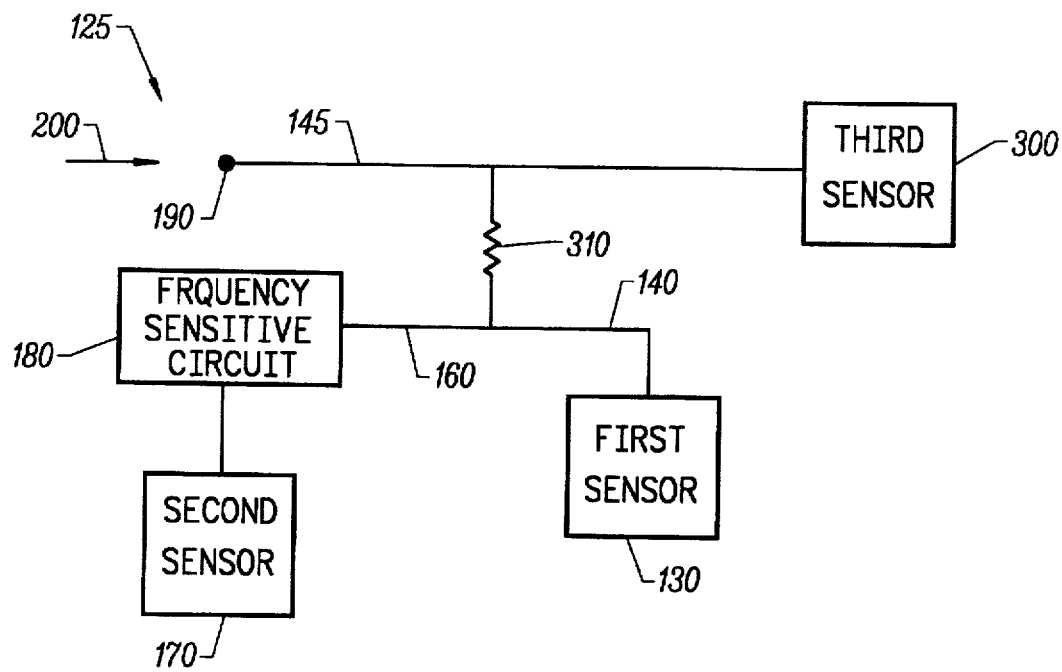
FIG. 7A illustrates a sixth embodiment of the present invention.
Figure 7B:
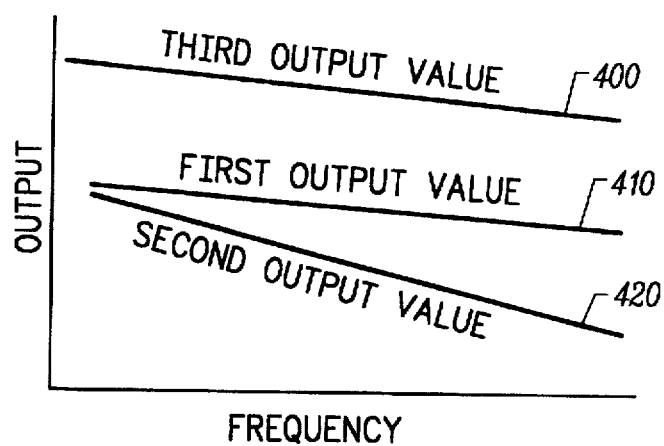
FIG. 7B illustrates a graph of the output versus frequency of the sixth embodiment of FIG. 7A.

FIG. 7A illustrates a sixth embodiment 125 of the present invention. This embodiment 125 uses a third sensor 300 and a resistor 310 to produce first 410, second 420 and third 400 outputs, as illustrated in FIG. 7B. An advantage of this embodiment is that the frequency sensitivity of the resistor 310 is common to both the first 130 and second 170 sensors.

In use, the resistor 310 taps off a small percentage of the microwave signal 200. This signal 200 is divided between the first 130 and the second 170 sensors, where the second output 420 (as illustrated in FIG. 7B) measured by the second sensor 170 has a slope versus frequency due to the frequency sensitive circuit 180 located between the resistor 310 and the second sensor 170. The use of this embodiment 125 is identical to the use of similarly numbered elements previously described with respect to FIG. 2A.

Although the invention has been described above with particularity, this was merely to teach one of ordinary skill in the art how to make and use the invention. Many modifications will fall within the scope of the invention, as the scope is defined by the following claims.

What is claimed is:

1. A power sensor for determining the frequency of a microwave signal received at a signal input node, comprising:

a path divider having an input providing the input signal node, a first output and a second output;

a first sensor having an input coupled to the first output of the path divider, the first sensor for producing a first output corresponding to the power of said microwave signal at said frequency;

a second sensor having an input coupled to the second output of the path divider, the second sensor for producing a second output corresponding to the power of said microwave signal at said frequency; and a length of transmission line coupling the second output of the path divider to the second sensor providing greater attenuation between the second output of the path divider and the second sensor than attenuation provided from the first output of the path divider to the first sensor, and distinguishing said second output from said first output so that a ratio of said outputs produces a unique value at said frequency.

2. The power sensor of claim 1, further comprising:

a third sensor; and a resistor connecting the input of said third sensor to the input of said path divider.

3. The power sensor of claim 1 wherein said transmission line is coaxial cable.

4. A power sensor for determining the frequency of a microwave signal received at a signal input node, comprising:

a microwave switch having a switch input connected to said signal input node, a first output, a second output;

a first sensor having an input coupled to the first output of the microwave switch, the first sensor for producing a first output corresponding to the power of said microwave signal at said frequency;

a second sensor having an input coupled to the second output of the microwave switch, the second sensor for producing a second output corresponding to the power of said microwave signal at said frequency; and a length of transmission line coupling the second output of the path divider to the second sensor providing greater attenuation between the second output of the path divider and the second sensor than attenuation provided from the first output of the path divider to the first sensor, and distinguishing said second output from said first output so that a ratio of said outputs produces a unique value at said frequency.

5. A power sensor for determining the frequency of a microwave signal received at a signal input node, comprising:

a first sensor having an input, the first sensor for producing a first output corresponding to the power of said microwave signal at said frequency;

a second sensor having an input, the second sensor for producing a second output corresponding to the power of said microwave signal at said frequency;

a coupler having a first terminal coupled to the signal input node, a second terminal coupled to the input of the first sensor, and a third terminal coupled to the input of the second sensor, said coupler distinguishing said second output from said first output so that a ratio of said outputs produces a unique value at said frequency.

* * * * *